US012778019B2

(12) United States Patent
Woods et al.

(10) Patent No.: US 12,778,019 B2
(45) Date of Patent: Nov. 3, 2026

(54) ELECTRIC MOWER

(71) Applicant: KUBOTA CORPORATION, Osaka (JP)

(72) Inventors: Franklin Woods, Gainesville, GA (US); Stephen Irvine, Gainesville, GA (US); Nicholas Peters, Gainesville, GA (US); Akihito Mihara, Gainesville, GA (US)

(73) Assignee: KUBOTA CORPORATION, Osaka (JP)

( * ) Notice: Subject to any disclaimer, the term of this patent is extended or adjusted under 35 U.S.C. 154(b) by 0 days.

(21) Appl. No.: 18/980,267

(22) Filed: Dec. 13, 2024

(65) Prior Publication Data

US 2026/0165252 A1 Jun. 18, 2026

Related U.S. Application Data

(60) Provisional application No. 63/698,808, filed on Sep. 25, 2024.

(51) Int. Cl.

| | |
|---|---|
| ***A01D 69/02*** | (2006.01) |
| ***B60K 1/02*** | (2006.01) |
| ***B60L 15/00*** | (2006.01) |
| ***B60L 50/60*** | (2019.01) |
| ***H02M 7/00*** | (2006.01) |
| ***H05K 7/20*** | (2006.01) |
| *A01D 34/64* | (2006.01) |
| *A01D 101/00* | (2006.01) |
| *B60R 16/02* | (2006.01) |
| *H02M 3/00* | (2006.01) |

(52) U.S. Cl.
CPC ................ *A01D 69/02* (2013.01); *B60K 1/02* (2013.01); *B60L 15/007* (2013.01); *B60L 50/60* (2019.02); *H02M 7/003* (2013.01); *H05K 7/209* (2013.01); *A01D 34/64* (2013.01); *A01D 2101/00* (2013.01); *B60L 2200/40* (2013.01); *B60L 2210/10* (2013.01); *B60L 2210/30* (2013.01); *B60R 16/0207* (2013.01); *H02M 3/003* (2021.05)

(58) Field of Classification Search
CPC ............... A01D 2101/10; B60L 15/007; B60L 2210/10; B60L 2210/30; H02M 3/003; H02M 7/00; H02M 3/00; H05K 7/20; B60R 16/02
See application file for complete search history.

(56) References Cited

U.S. PATENT DOCUMENTS

| | | | | |
|---|---|---|---|---|
| 2018/0303027 | A1* | 10/2018 | Koike ..................... | B60L 50/51 |
| 2022/0408638 | A1 | 12/2022 | Ito et al. | |
| 2024/0140207 | A1* | 5/2024 | Johns .................... | A01D 34/74 |

FOREIGN PATENT DOCUMENTS

| | | | | |
|---|---|---|---|---|
| CN | 115315177 A | * 11/2022 | ............. | H02J 7/855 |

* cited by examiner

*Primary Examiner* — Robert L Deberadinis
(74) *Attorney, Agent, or Firm* — Greenblum & Bernstein, P.L.C.

(57) ABSTRACT

An electric mower includes: a body; a main battery on the body; and two inverters each configured to convert direct-current electric power from the main battery into alternating-current electric power, wherein the inverters are arranged laterally and each inclined downward in a laterally outward direction.

7 Claims, 6 Drawing Sheets

ELECTRIC MOWER

FIELD OF THE INVENTION

The present invention relates to an electric mower.

BACKGROUND OF THE INVENTION

As disclosed in US 2022/0408638A1, an electric mower includes wheels and a mower unit. The wheels are drivable on electric power from a battery for the electric mower to travel. The mower unit is also drivable on electric power from the battery to cut grass. Such an electric mower includes components such as a battery and an inverter at a back portion of its body.

The electric mower also includes components such as a fuse box and a harness at a portion at which the battery and the inverter are disposed, creating a need to arrange such mount components efficiently.

Bending a harness sharply for arranging mount components efficiently may, however, cause a stress to be concentrated at the bend or an end of the harness and thereby cause an excessive load on the harness.

This has led to a demand for an electric mower including mount components arranged efficiently without the need to bend a harness and cause an excessive load on the harness.

An electric mower includes in addition to an inverter a large number of mount components such as a DC/DC converter and a fuse box. Producing an electric mower has unfortunately involved many steps to attach those mount components.

This has led to a demand for an electric mower that involves fewer steps for attachment of mount components such as a DC/DC converter and a fuse box in addition to an inverter.

Producing or maintaining an electric mower involves difficult work of, for example, connecting to a fuse box a harness through which a high-voltage electric current flows or connecting to a DC/DC converter a harness through which a low-voltage electric current flows.

This has led to a demand for an electric mower that allows a worker to easily understand where to connect a harness during production and maintenance.

SUMMARY OF THE INVENTION

An electric mower as an embodiment of the present invention includes: a body; a main battery on the body; two inverters each configured to convert direct-current electric power from the main battery into alternating-current electric power, a cover including: a back wall; and a pair of left and right side walls each extending forward from the back wall, the cover covering the main battery and the inverters, wherein the inverters are arranged laterally and each inclined downward in a laterally outward direction.

With the above configuration, the inverters are inclined and thus occupy a smaller lateral space inside the cover, meaning a larger space for other mount components inside the cover. This allows for efficient arrangement of mount components such as an inverter.

The inverters are each inclined downward in a laterally outward direction. This allows harnesses connected to respective lower portions of the inverters to extend downward without being bent sharply. Electric current as converted by the inverters may be used by an electric motor disposed at a lower portion of the body and configured to drive aa driving wheel. In such cases, the above configuration eliminates the need to sharply bend a harness.

An electric mower as an embodiment of the present invention includes: a body; a main battery on the body; an inverter configured to convert direct-current electric power from the main battery into alternating-current electric power; a fuse box containing a fuse; and a module bracket holding the inverter and the fuse box, disposed above the main battery, and held by the body.

The above configuration allows a worker to cause the module bracket to hold the inverter and the fuse box beforehand. This allows a worker to simply attach the module bracket to the body for attachment of the inverter and the fuse box to the body during production. The above configuration thereby reduces the number of steps for attaching the inverter and the fuse box.

An electric mower as an embodiment of the present invention includes: a body; a battery on the body; a DC/DC converter configured to adjust a level of a direct-current voltage from the battery and output the direct-current voltage as adjusted; and a fuse box containing a fuse, wherein the DC/DC converter and the fuse box are each at a back portion of the body, and the fuse box is above the DC/DC converter.

The above configuration allows a harness through which a low-voltage electric current flows to be connected to a DC/DC converter at a low position and a harness through which a high-voltage electric current flows to be connected to a fuse box at a high position. This allows a worker to easily understand where to connect a harness during production and maintenance.

BRIEF DESCRIPTION OF THE DRAWINGS

The present disclosure is further described in the detail description which follows, in reference to the noted plurality of drawings by way of non-limiting examples of exemplary embodiments of the present disclosure, in which like reference numerals represent similar parts throughout the several views of the drawings, and wherein.

DETAILED DESCRIPTION OF THE INVENTION

Figure 1:
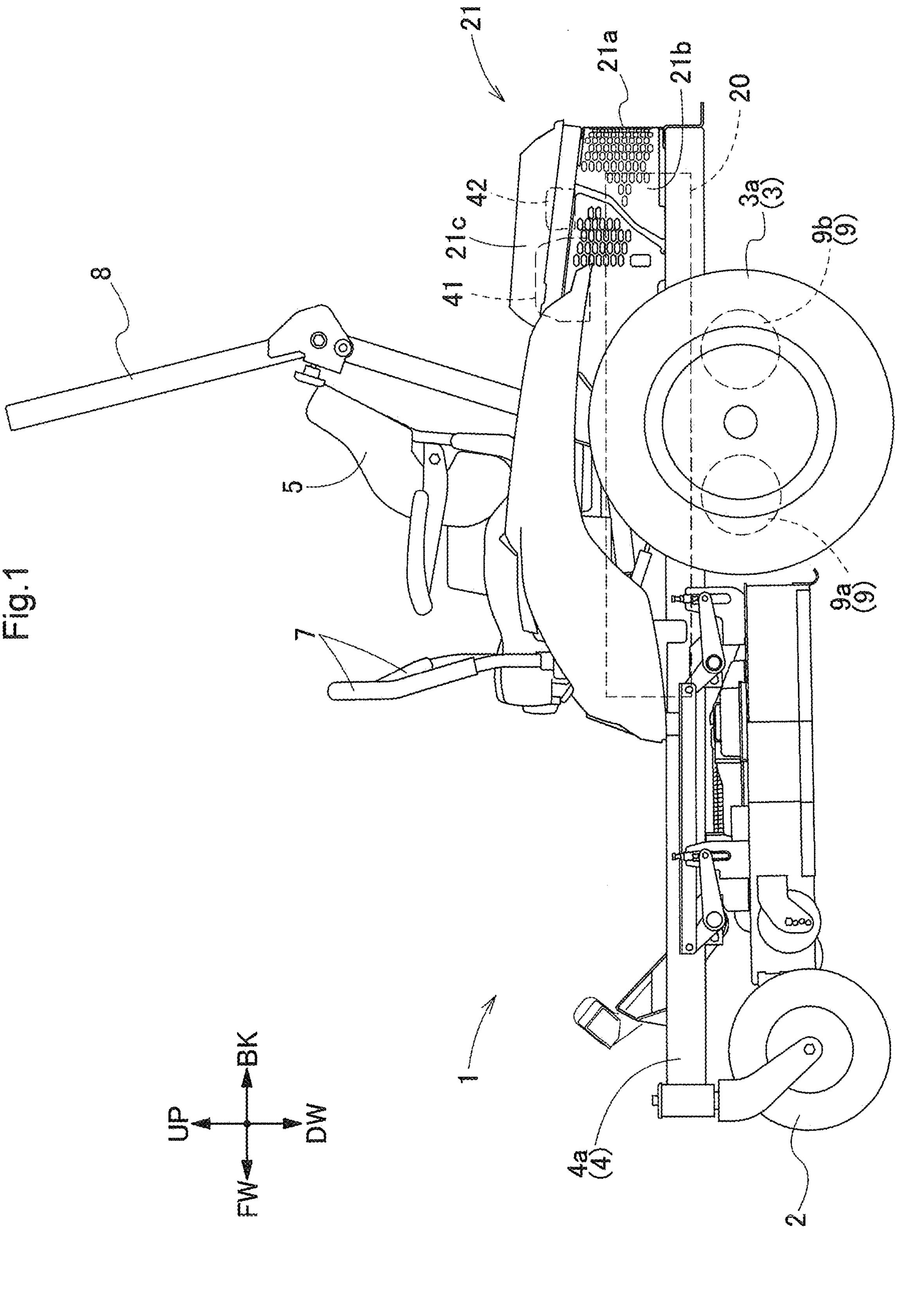
FIG. 1 is a side view of an electric mower.

The description below deals with an embodiment of the present invention with reference to drawings. Unless otherwise specified, the description below uses terms such as "front" and "forward" to refer to the direction indicated with arrow FW in the drawings, terms such as "back" and "backward" to refer to the direction indicated with arrow BK in the drawings, terms such as "left" and "leftward" to refer to the direction indicated with arrow LH in the drawings, terms such as "right" and "rightward" to refer to the direction indicated with arrow RH in the drawings, terms such as "above" and "upward" to refer to the direction indicated with arrow UP in the drawings, and terms such as "below" and "downward" to refer to the direction indicated with arrow DW in the drawings.

Overall Configuration of Electric Mower

Figure 2:
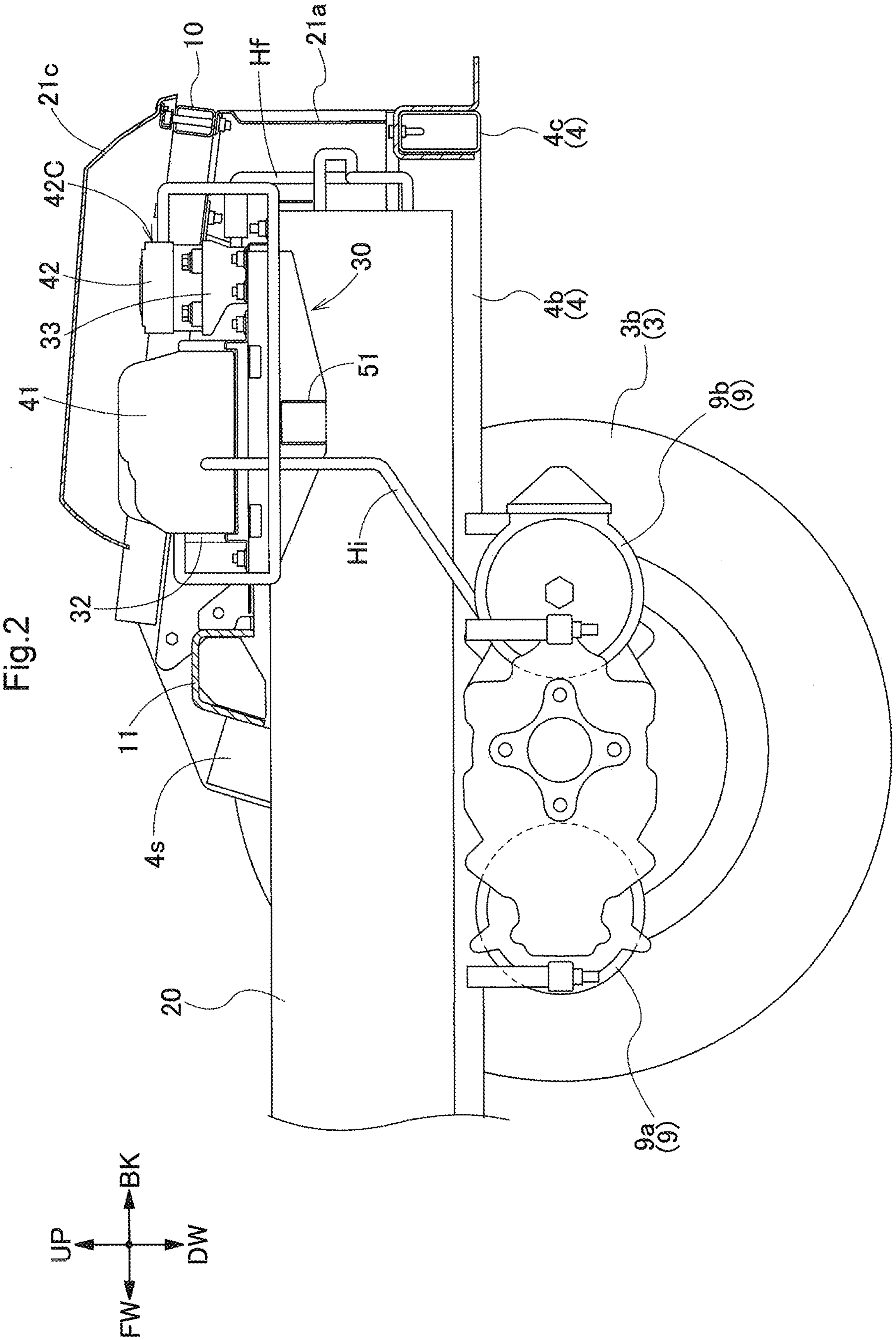
FIG. 2 is a side view of a battery and various mount components.

The description below deals with an electric mower as an embodiment. As illustrated in FIGS. 1 and 2, the electric mower is of a riding type, and includes a body 1 provided with front wheels 2, drive wheels 3, and a body frame 4. The front wheels 2 are namely a left front wheel 2*a* and a right front wheel 2*b* each in the form of a rotatable caster. The drive wheels 3 are namely a left rear wheel 3*a* and a right rear wheel 3*b*. The body frame 4 is supported by the front wheels 2 and the drive wheels 3 on the ground. The body frame 4 includes a left frame section 4*a*, a right frame section 4*b*, and a back end section 4*c* coupling a back end portion of the left frame section 4*a* to a back end portion of the right frame section 4*b*.

The body 1 is provided with a driver's seat 5 on which an operator is able to sit. The body 1 is provided with a floor plate (not illustrated in the drawings) in front of the driver's seat 5 on which floor plate 6 the operator is able to place their feet. The body 1 is provided with left and right control levers 7 to the left and right of the driver's seat 5. The body 1 is provided with two electric motors 9 configured to drive the respective drive wheels 3, namely, a motor 9*a* configured to drive the left rear wheel 3*a* and a motor 9*b* configured to drive the right rear wheel 3*b*. The operator is able to operate the control levers 7 to change the respective rotation speeds of the left rear wheel 3*a* and the right rear wheel 3*b*.

The electric mower includes a rollover protection structure (ROPS) 8 disposed backward of the driver's seat 5 and fixed to the body frame 4. The left and right frame sections 4*a* and 4*b* include respective ROPS supports 4*c* to which the ROPS 8 is fixed.

Figure 3:
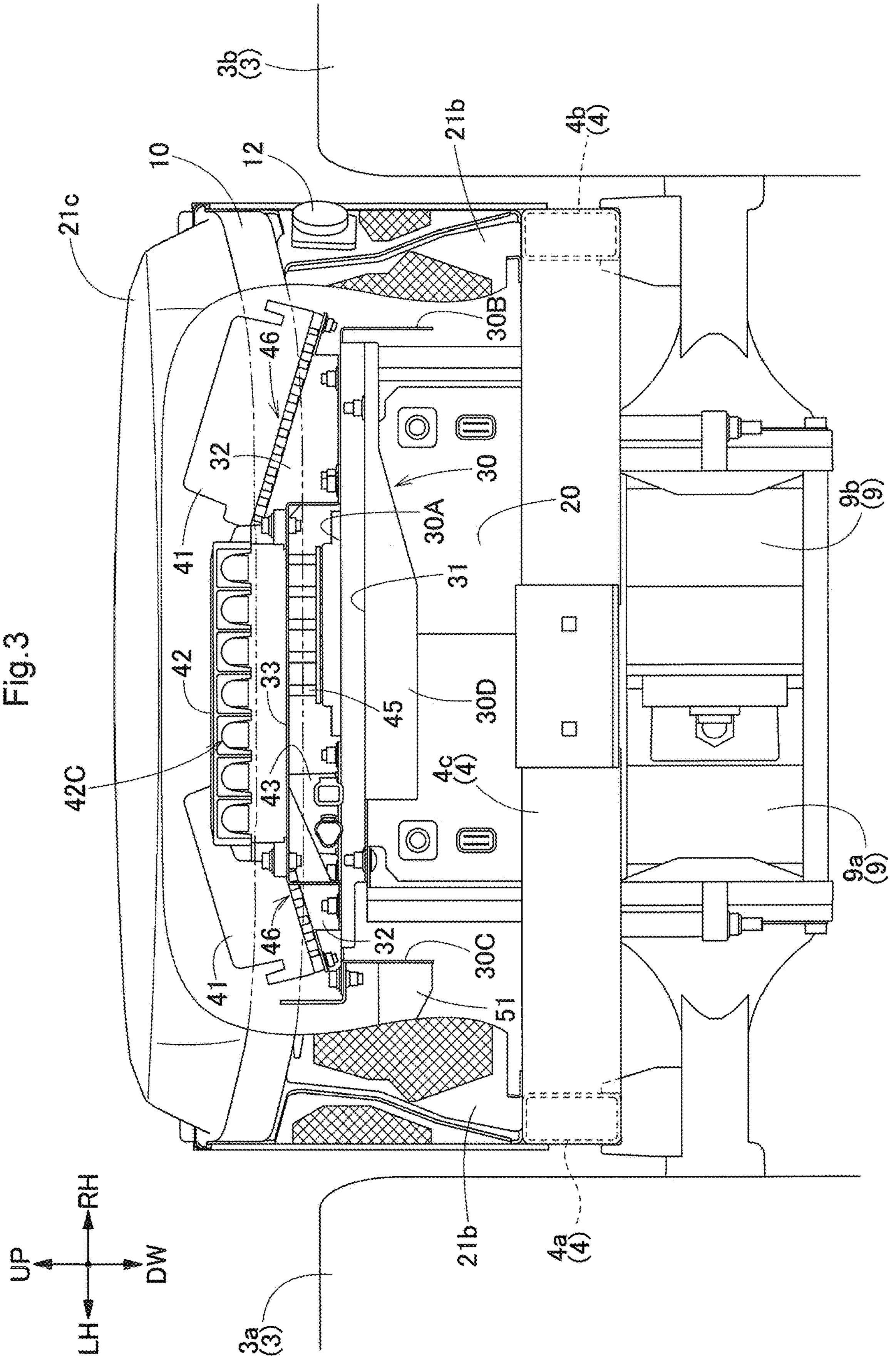
FIG. 3 is a rear view of a battery and various mount components.

As illustrated in FIGS. 1 to 3, the body 1 includes a battery 20 ("main battery" for the present invention) in a space extending from respective back end portions of the left frame section 4*a* and the right frame section 4*b* to below the driver's seat 5. As illustrated in FIG. 3, the electric mower includes a cover 21 covering at least a portion of the battery 20. The cover 21 includes a back wall 21*a* backward of the battery 20, a pair of left and right side walls 21*b* each extending forward from the back wall 21*a*, and an upper cover section 21*c* covering from above a space defined by the back wall 21*a* and the side walls 21*b*. The electric mower includes an upper frame 10 extending from an upper end portion of the back wall 21*a* to respective upper end portions of the side walls 21*b*. The upper cover section 21*c* is bolted to the upper face of the upper frame 10.

The battery 20 is between the left frame section 4*a* and the right frame section 4*b* in a plan view. The battery 20 is disposed toward a first side (for the present embodiment, the right side) in the left-right direction of the electric mower between the left frame section 4*a* and the right frame section 4*b*.

Configuration of Module Bracket

As illustrated in FIGS. 2 to 5, the electric mower includes a module bracket 30 disposed above the battery 20 and supporting such mount components as two inverters 41 each configured to convert direct-current electric power from the battery 20 into alternating-current electric power, a fuse box 42 containing fuses, a DC/DC converter 43 configured to adjust the level of a direct-current voltage from the battery 20 and output the adjusted voltage, and a low-voltage battery 44 ("auxiliary battery" for the present invention) separate from the battery 20 and configured to feed electric power to, for example, lighting elements.

The electric mower includes a front portion support 11 bolted to the ROPS supports 4*s* and supporting a front portion of the module bracket 30. The module bracket 30 has a back portion supported by a back end portion of the battery 20. With this configuration, the module bracket 30 is disposed above the battery 20 and supported by the body 1 with the front portion support 11 and the battery 20 in-between.

The module bracket 30 includes a top plate 30A, a right plate 30B, a left plate 30C, and a back plate 30D. The top plate 30A is rectangular and above the battery 20. The right plate 30B extends downward from the right edge of the top plate 30A and faces the right-side wall of the battery 20. The left plate 30C extends downward from the left edge of the top plate 30A and faces the left-side wall of the battery 20. The back plate 30D extends downward from the back edge of the top plate 30A and faces the back-side wall of the battery 20.

Figure 6:
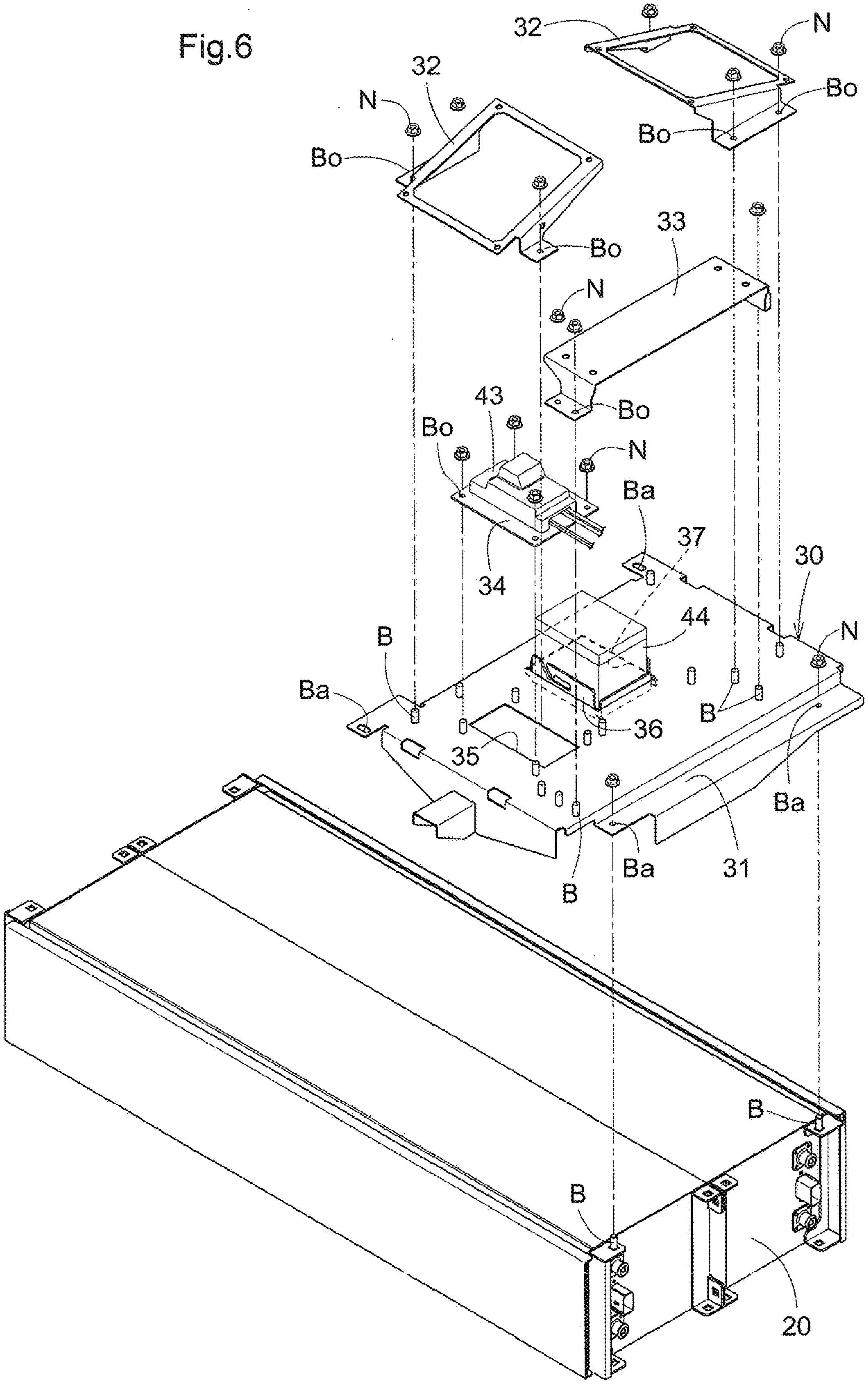
FIG. 6 is an exploded view of a module bracket and supports for various mount components.

As illustrated in FIG. 6, the top plate 30A has left and right front corners with respective bolt holes Ba for attachment of the module bracket 30. The top plate 30A includes at a back portion a step section 31 with two bolt holes Ba for attachment of the module bracket 30. The bolt holes Ba in the front end portion of the top plate 30A receive respective bolts B screwed through the front portion support 11. The bolt holes Ba in the step section 31 receive respective bolts B screwed through a back end portion of the battery 20. The top plate 30A is fastened with respective nuts N on the bolts B.

The module bracket 30 is in the form of a plate so bent as to include a right plate 30B, a left plate 30C, and a back plate 30D. The back plate 30D extends downward from the back end of the step section 31.

The left plate 30C is provided with s support base 51 to which is fixed a support (not illustrated in the drawings) supporting, for example, a harness.

How Inverters are Supported

As illustrated in FIGS. 3 to 6, the electric mower includes two invertor mount brackets 32 ("holder" for the present invention) attached to respective left and right portions of the top plate 30A and configured for the module bracket 30 to hold the inverters 41. The invertor mount brackets 32 each include a fixing section 32*a*, a first contact section 32*b*, and a second contact section 32*c*. The fixing section 32*a* is a section to which a corresponding inverter 41 is fixed. The first contact section 32*b* is on a first side of the fixing section 32*a* in the front-back direction and in contact with the module bracket 30. The second contact section 32*c* is on a second side of the fixing section 32*a* in the front-back direction and in contact with the module bracket 30.

The first and second contact sections 32*b* and 32*c* have two or more bolt holes Bo through which respective bolts B extend for fastening the invertor mount bracket 32 to the module bracket 30. The number of bolt holes Bo in the first contact section 32*b* differs from that of bolt holes Bo in the second contact section 32*c*; for the present embodiment, the first contact section 32*b* has a single bolt hole Bo, whereas the second contact section 32*c* has two bolt holes Bo. The top plate 30A has inverter-attachment bolt holes in positional correspondence with the bolt hole Bo in the first contact section 32*b* and the bolt holes Bo in the second contact section 32*c*. The difference between the number of bolt holes Bo in the first contact section 32*b* and that of bolt holes Bo in the second contact section 32*c* prevents the user from misorienting the invertor mount brackets 32 during attachment to the module bracket 30. The bolt holes Bo receive respective bolts B each welded to the back face (lower face) of an inverter-attachment bolt hole section of the top plate 30A. The invertor mount brackets 32 are fastened to the module bracket 30 with respective nuts N on the bolts B.

The present embodiment is configured such that the invertor mount bracket 32 to the right includes a first contact section 32*b* forward of the fixing section 32*a* and a second contact section 32*c* backward of the fixing section 32*a*, whereas the invertor mount bracket 32 to the left includes a first contact section 32*b* backward of the fixing section 32*a* and a second contact section 32*c* forward of the fixing section 32*a*.

With each invertor mount bracket 32 held by the module bracket 30, the fixing section 32*a* is above the first and second contact sections 32*b* and 32*c* and inclined downward in a laterally outward direction. The inverters 41 are each bolted to its corresponding fixing section 32*a*.

The inverters 41 are, as held by the respective invertor mount brackets 32 configured as above, arranged laterally and each inclined downward in a laterally outward direction. The inverters 41 each include at a laterally outward portion a wiring connection portion 41C to which is a harness Hi described later is connected.

The inverters 41 each have a face (lower face) facing the module bracket 30 which face is provided with a heat sink 46. The invertor mount brackets 32 each support its corresponding inverter 41 and heat sink 46 at the fixing section 32*a*. With this configuration, each heat sink 46 is above the upper face of the module bracket 30 with a space in-between.

How Fuse Box is Supported

As illustrated in FIGS. 3 to 6, the electric mower includes a fuse box mount bracket 33 attached to a portion of the top plate 30A which portion is backward of the portions to which the respective inverters 41 are attached and configured for the module bracket 30 to hold the fuse box 42. The fuse box mount bracket 33 includes a fixing section 33*a*, a first contact section 33*b*, and a second contact section 33*c*. The fixing section 33*a* is a section to which the fuse box 42 is fixed. The first contact section 33*b* is to the right of the fixing section 33*a* and in contact with the module bracket 30. The second contact section 33*c* is to the left of the fixing section 33*a* and in contact with the module bracket 30.

The first and second contact sections 33*b* and 33*c* have two or more bolt holes Bo through which respective bolts B extend for fastening the invertor mount bracket 32 to the module bracket 30. For the present embodiment, the first contact section 33*b* has a single bolt hole Bo, whereas the second contact section 33*c* has two bolt holes Bo. The top plate 30A has fuse box-attachment bolt holes in positional correspondence with the bolt hole Bo in the first contact section 33*b* and the bolt holes Bo in the second contact section 33*c*. The difference between the number of bolt holes Bo in the first contact section 33*b* and that of bolt holes Bo in the second contact section 33*c* prevents the user from misorienting the fuse box mount bracket 33 during attachment to the module bracket 30. The bolt holes Bo receive respective bolts B each welded to the back face (lower face) of a fuse box-attachment bolt hole section of the top plate 30A. The fuse box mount bracket 33 is fastened to the module bracket 30 with respective nuts N on the bolts B.

With the fuse box mount bracket 33 held by the module bracket 30, the fixing section 33*a* is above the first and second contact sections 33*b* and 33*c*. The fuse box mount bracket 33 allows a harness to extend through a space below the fixing section 33*a*. The fuse box 42 is bolted to its corresponding fixing section 33*a*.

The fuse box 42 is, as held by the fuse box mount bracket 33 configured as above, above the top plate 30A and the back end of the back wall 21*a* (or the upper frame 10), which is backward of the fuse box 42. The fuse box 42 includes at a back portion a wiring connection portion 42C for wiring connection.

How DC/DC Converter is Supported

As illustrated in FIGS. 3 to 6, the electric mower includes a DC/DC converter mount bracket 34 attached to a portion of the top plate 30A which portion is below the left inverter 41 and configured for the module bracket 30 to hold the DC/DC converter 43. That portion of the top plate 30A to which the DC/DC converter mount bracket 34 is attached has a cooling opening 35 covered by the DC/DC converter mount bracket 34.

The DC/DC converter mount bracket 34 is in the form of a rectangular plate having four corners with respective bolt holes Bo. The bolt holes Bo receive respective bolts B each welded to the back face (lower face) of a DC/DC converter-attachment bolt hole section of the top plate 30A. The DC/DC converter mount bracket 34 is fastened to the module bracket 30 with respective nuts N on the bolts B. The DC/DC converter 43 is bolted to the DC/DC converter mount bracket 34.

How Low-Voltage Battery is Supported

The electric mower includes a pocket 36 disposed at a portion of the top plate 30A which portion is laterally between the inverters 41 and holding the low-voltage battery 44. The pocket 36 is shaped to include a depression in which the low-voltage battery 44 is fitted. The low-voltage battery 44 is, as fitted in the pocket 36, fixed with a fixing belt.

The pocket 36 is a member separate from the top plate 30A. The pocket 36 is fitted in an opening 37 in the top plate 30A and welded to the back face (lower face) of the top plate 30A.

Configuration of Ground Terminals

Figure 4:
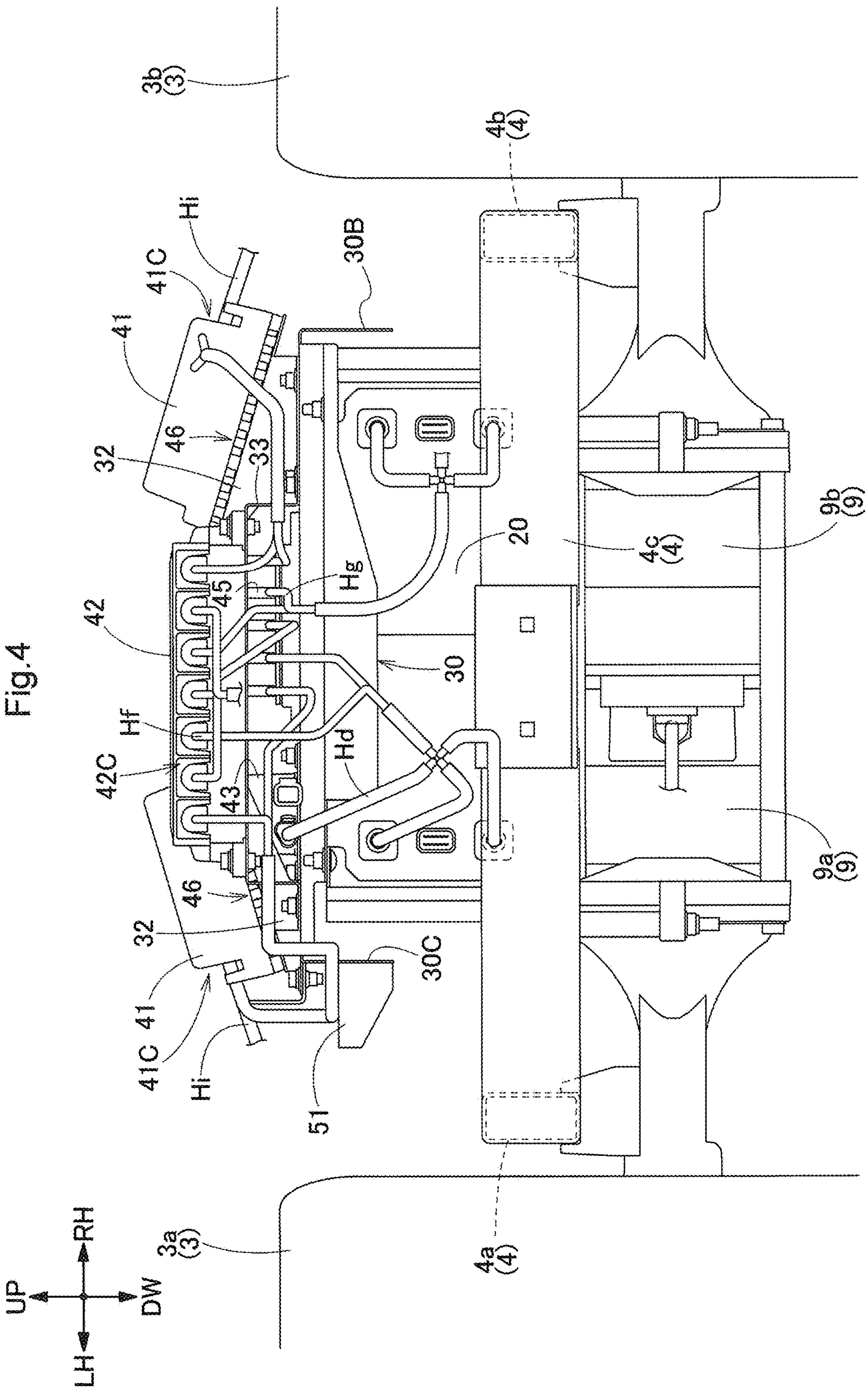
FIG. 4 is a rear view of various mount components and harnesses connected thereto.
Figure 5:
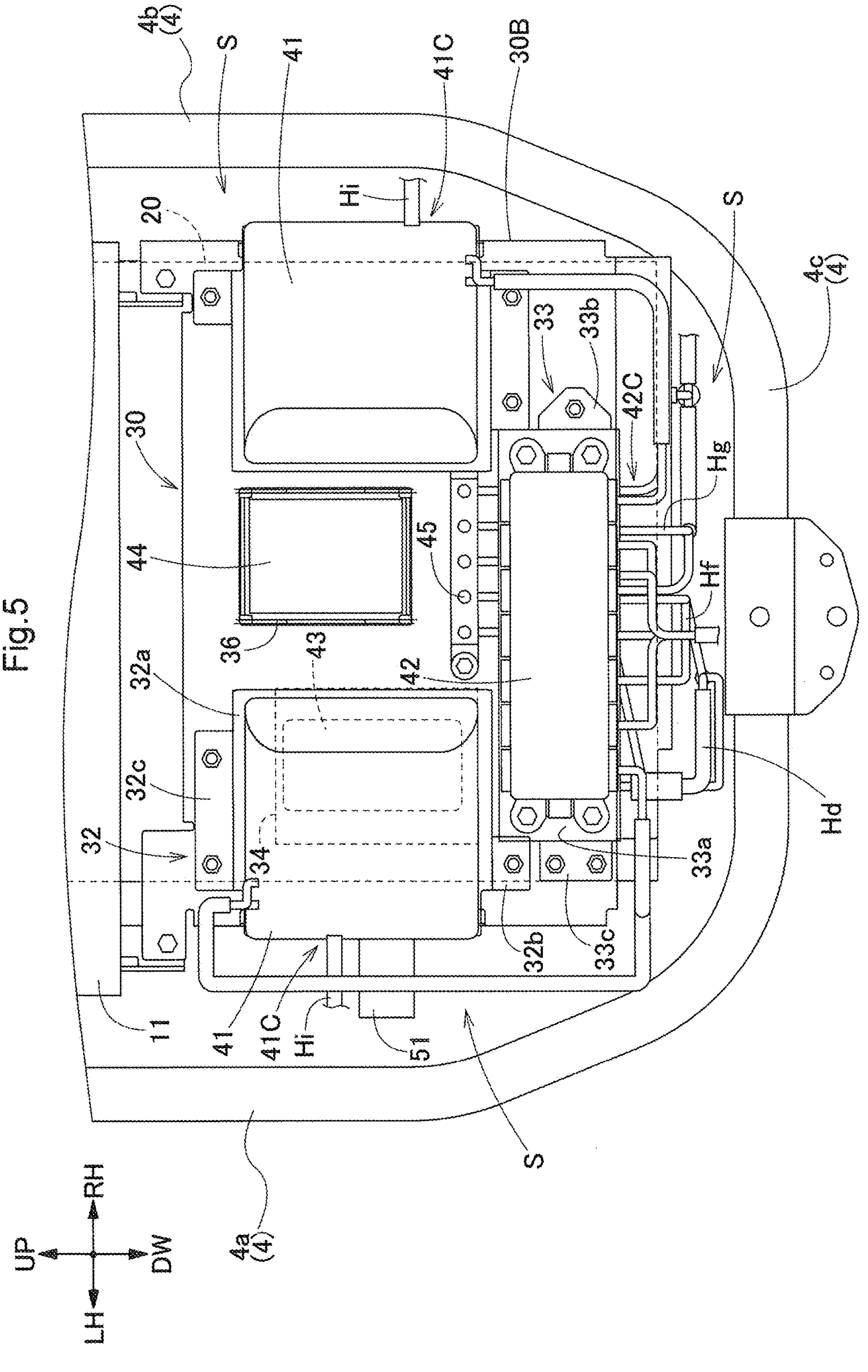
FIG. 5 is a plan view of various mount components and harnesses connected thereto.

As illustrated in FIGS. 3 to 5, the electric mower includes two or more ground terminals 45 each disposed at a portion of the top plate 30A which portion is between the fuse box 42 and the low-voltage battery 44 and having a ground potential. The present embodiment includes five ground terminals 45 arranged laterally.

How Harnesses are Arranged

As illustrated in FIGS. 2 to 5, the electric mower includes two harnesses Hi each for connecting an inverter 41 to the corresponding electric motor 9. Specifically, each harness Hi is connected to the wiring connection portion 41C (which is at a laterally outward end portion of the inverter 41), that is, a lower end portion of the inverter 41 inclined. The harness Hi extends through a space S between the battery 20 and a side wall 21*b* of the cover 21, and is connected to the corresponding electric motor 9 below the battery 20.

The electric mower includes a harness Hf connected to the wiring connection portion 42C of the fuse box 42. The harness Hf is also connected to the battery 20, the inverters 41, and a charging socket 12 (see FIG. 3), and allows a high-voltage electric current to flow therethrough. The harness Hf extends from the wiring connection portion 42C (which is at the back face of the fuse box 42 at a back portion of the body 1) through, for example, a space S between the battery 20 and the back wall 21*a* to be connected to different mount components.

The electric mower includes a harness Hd ("first harness" for the present invention) connected to the DC/DC converter 43. The harness Hd extends from the DC/DC converter 43 (which is at a back portion of the body 1) through a space below the fuse box 42 (which is above the DC/DC converter 43) and, for example, the space S between the battery 20 and the back wall 21*a* to be connected to the battery 20 and different mount components.

The electric mower includes a harness Hg ("second harness" for the present invention) connected to the ground terminals 45. The harness Hg extends backward through the space below the fuse box 42 and, for example, the space S between the battery 20 and the back wall 21*a* to be connected to the battery 20 and different mount components. The harness Hg extends backward through a space below the fuse box 42 and to the right of the harness Hd, which is connected to the DC/DC converter 43. With this configuration, the harnesses Hg and Hd each extend from a position backward of each heat sink 46 in a direction away from each heat sink 46 (backward). This prevents the harnesses Hg and Hd from entering a space between each heat sink 46 and the module bracket 30.

Alternative Embodiments

The description below deals with example alternatives to the embodiment described above.

(1) The embodiment described above under "Detailed Description of the Invention" is an example including a low-voltage battery 44. The present invention is, however, not limited to such a configuration, and may omit the low-voltage battery 44.

(2) The embodiment described above under "Detailed Description of the Invention" is an example in which the top plate 30A has a cooling opening 35. The present invention is, however, not limited to such a configuration, and may be configured such that the top plate 30A has no opening 35.

(3) The embodiment described above under "Detailed Description of the Invention" is an example in which the module bracket 30 is disposed above the battery 20 and supported by the body 1 with the front portion support 11 and the battery 20 in-between. The present invention is, however, not limited to such a configuration; for instance, the module bracket 30 may be supported by the body 1 with only either the front portion support 11 or the battery 20 in-between (4) The embodiment described above under "Detailed Description of the Invention" is an example in which the first contact section 32*b*, 33*b* has a single bolt hole Bo, whereas the second contact section 32*c*, 33*c* has two bolt holes Bo. The present invention is, however, not limited to such a configuration. The number of bolt holes Bo in the first contact section 32*b*, 33*b* simply differs from that of bolt holes Bo in the second contact section 32*c*, 33*c*. The embodiment may be altered such that the first contact section 32*b*, 33*b* has two or more bolt holes Bo, whereas the second contact section 32*c*, 33*c* has a single bolt hole Bo or three or more bolt holes Bo.

(5) The embodiment described above under "Detailed Description of the Invention" is an example including heat sinks 46. The present invention is, however, not limited to such a configuration, and may omit the heat sinks 46.

The arrangements disclosed for the above embodiments (including the alternative embodiments; hereinafter the same applies) may each be combined with an arrangement disclosed for another embodiment, as long as such a combination does not cause a contradiction. Further, the embodiments disclosed in the present specification are mere examples. The present invention is not limited to those embodiments, and may be altered as appropriate, as long as such an alteration does not result in a failure to attain an object of the present invention.

REFERENCE SIGNS LIST

1 Body
3 Driving wheel
9 Electric motor
10 Upper frame
20 Battery (main battery)
21 Cover
21*a* Back wall
21*b* Side wall
21*c* Upper cover section
30 Module bracket
32 Inverter mount bracket (holder)
32*b* First contact section
32*c* Second contact section
41 Inverter
41C Wiring connection portion
42 Fuse box
42C Wiring connection portion
43 DC/DC converter
44 Low-voltage battery (auxiliary battery)
45 Ground terminal
46 Heat sink
Ba Bolt hole
Bo Bolt hole
Hi Harness
Hf Harness
Hd Harness (first harness)
Hg Harness (second harness)

The invention claimed is:

1. An electric mower, comprising:
a body;
a main battery on the body;
a DC/DC converter configured to adjust a level of a direct-current voltage from the main battery and output the direct-current voltage as adjusted;
a fuse box containing a fuse;
a wiring connection portion provided at a rearward face of the fuse box and to which a harness is connected, the harness extending rearwardly; and
a first harness connected to a rearward facing surface of the DC/DC converter, the first harness extending rearwardly,
wherein an electric current flowing through the first harness has a lower voltage than an electric current flowing through the harness,
the DC/DC converter and the fuse box are each at a back portion of the body, and
the fuse box is above the DC/DC converter, such that the harness having a higher voltage and connecting to the fuse box connects at a relatively high position on the electric mower and the first harness having the lower voltage and connecting to the DC/DC converter connects at a relatively low position on the electric mower, the relatively high position indicating a higher-voltage harness connection position and the relatively low position indicating a lower-voltage first harness connection position.

2. The electric mower according to claim 1, wherein the fuse box includes the wiring connection portion is at a back portion of the fuse box.

3. The electric mower according to claim 1, further comprising:
a cover including:

a back wall backward of the fuse box; and a pair of left and right side walls extending forward respectively from left and right end portions of the back wall, wherein the fuse box is above a back end of the back wall.

4. The electric mower according to claim 1, wherein the first harness extends through a space below the fuse box.

5. The electric mower according to claim 4, further comprising:

a plurality of ground terminals each having a ground potential; and a second harness extending through a space below the fuse box and to right of the first harness and connected to the ground terminals.

6. The electric mower according to claim 5, further comprising:

an electric motor;

an inverter configured to convert direct-current electric power from the main battery into alternating-current electric power and output the electric power to the electric motor; and a heat sink disposed on a lower face of the inverter, wherein the first harness and the second harness each extend backward from a position rearward of the heat sink.

7. The electric mower according to claim 4, wherein the DC/DC converter and the fuse box are above the main battery.

* * * * *